(12) United States Patent
Schurr et al.

(10) Patent No.: US 9,232,675 B2
(45) Date of Patent: Jan. 5, 2016

(54) OPERATOR CABINET WITH OPERATOR TERMINAL

(71) Applicant: Pilz GmbH & Co. KG, Ostfildern (DE)

(72) Inventors: Daniel Schurr, Ostfildern (DE); Christoph Zell, Ostfildern (DE); Joachim Rink, Ostfildern (DE)

(73) Assignee: PILZ GMBH & CO. KG, Ostfildern (DE)

( * ) Notice: Subject to any disclaimer, the term of this patent is extended or adjusted under 35 U.S.C. 154(b) by 171 days.

(21) Appl. No.: 14/170,877

(22) Filed: Feb. 3, 2014

(65) Prior Publication Data

US 2014/0177148 A1     Jun. 26, 2014

Related U.S. Application Data

(63) Continuation of application No. PCT/EP2012/064450, filed on Jul. 24, 2012.

(30) Foreign Application Priority Data

Aug. 3, 2011  (DE) .......................... 10 2011 109 576

(51) Int. Cl.
*H05K 7/14* (2006.01)
*H05K 5/00* (2006.01)

(52) U.S. Cl.
CPC ................ *H05K 7/14* (2013.01); *H05K 5/0017* (2013.01); *H05K 7/1481* (2013.01)

(58) Field of Classification Search
CPC .......... H01R 33/00; H01R 13/64; H05K 7/12; H05K 5/00; H05K 7/10; B23P 21/00; B23P 11/00; G06F 1/16; H02G 3/088; A47B 67/02; E04B 1/00; A47F 5/08
See application file for complete search history.

(56) References Cited

U.S. PATENT DOCUMENTS 6,310,287 B1 * 10/2001 Schiedegger .......... H02G 3/123
                                                    174/17 CT
6,323,424 B1 * 11/2001 He ......................... H02G 3/18
                                                    174/58

(Continued)

FOREIGN PATENT DOCUMENTS

WO    WO 95/05062         2/1995
WO    WO 03/001798 A1     1/2003
WO    WO 2008/143321 A1  11/2008

OTHER PUBLICATIONS

ISA/EP; International Search Report; mailed Jan. 18, 2013; 3 pp.

(Continued)

*Primary Examiner* — Hoa C Nguyen
*Assistant Examiner* — Xanthia C Cunningham
(74) *Attorney, Agent, or Firm* — Harness, Dickey & Pierce, P.L.C.

(57) ABSTRACT

An operator cabinet has a wall having a front side, a rear side and a cutout defined by an inner edge. An operator terminal is installed in the cutout and has a frame surrounding a display for displaying at least one system state of a technical system. The outer frame edge is dimensioned so as to be larger than the inner edge of the cutout, with the result that, when installed, the frame can rest on the front side of the wall. A plate having an outer plate edge is dimensioned so as to be larger than the inner edge of the cutout with the result that, when installed, the plate can rest on the rear side of the wall. A plurality of bolts are secured at one end on the frame and extend, when installed, through the cutout and then through corresponding holes in the plate.

16 Claims, 6 Drawing Sheets

(56) References Cited

U.S. PATENT DOCUMENTS

| | | | | |
|---|---|---|---|---|
| 6,825,414 B2* | 11/2004 | Vagedes | | H02G 3/123 174/54 |
| 7,072,179 B1* | 7/2006 | Curran | | G06F 1/16 165/104.32 |
| 7,188,400 B1 | 3/2007 | Beseth et al. | | |
| 7,566,034 B2* | 7/2009 | Bonshor | | A47J 17/02 174/67 |
| 7,735,790 B2* | 6/2010 | Bonshor | | A47J 17/02 174/67 |
| 8,231,022 B2* | 7/2012 | Goldenne | | H02G 3/121 174/50 |
| 2003/0041539 A1* | 3/2003 | Bernacki | | E06B 3/5892 52/204.54 |
| 2004/0212282 A1* | 10/2004 | McElheney | | G06F 1/16 312/242 |
| 2006/0231282 A1* | 10/2006 | Greenfield | | H02G 3/14 174/67 |
| 2006/0260216 A1* | 11/2006 | Bonshor | | E06B 1/62 52/97 |
| 2006/0278775 A1* | 12/2006 | Allen | | E04F 17/04 248/176.1 |
| 2007/0175168 A1* | 8/2007 | Bonshor | | F24F 13/082 248/307 |
| 2008/0223601 A1* | 9/2008 | Johnson | | H02G 3/14 174/67 |
| 2008/0256880 A1* | 10/2008 | Nurenberg | | H02G 3/088 52/198 |
| 2009/0084782 A1* | 4/2009 | Helmer | | H02G 3/088 220/3.8 |
| 2010/0077681 A1* | 4/2010 | McCleskey | | H02G 3/088 52/220.1 |
| 2010/0099279 A1* | 4/2010 | Homme | | H01R 13/5202 439/78 |
| 2010/0122826 A1* | 5/2010 | de la Borbolla | | H02G 3/088 174/54 |

OTHER PUBLICATIONS

IPEA/EP; English language translation of International Preliminary Report on Patentability (Chapter II); mailed Feb. 13, 2014; 11 pp.

Pilz Industriecomputer; Pipanel-Monitor, Nr. 19 557; Nov. 2000; 62 pp.

PMIvisu/PMIopen IV, Operating manual Nr. 21 897-01; Jan. 2008; 42 pp.

* cited by examiner

Fig.6

OPERATOR CABINET WITH OPERATOR TERMINAL

CROSS-REFERENCES TO RELATED APPLICATIONS

This application is a continuation of international patent application PCT/EP2012/064450 filed on Jul. 24, 2012 designating the U.S., which international patent application has been published in German language and claims priority from German patent application DE 10 2011 109 576.8 filed on Aug. 3, 2011. The entire contents of these priority applications are incorporated herein by reference.

BACKGROUND OF THE INVENTION

The present invention relates to an operator cabinet including an operator terminal for operating a technical system.

An operator terminal for operating a technical system should be understood within the context of the present invention as meaning an operator terminal suitable for displaying at least one state of the technical system (for example for diagnosis) in order that a user can operate the technical system correspondingly (for example by actuating an emergency stop switch). In addition, the operator terminal can also be configured for receiving an input of an operating command, by means of which the user can operate or manually control the technical system.

An operator terminal of this type is, for example, an operator terminal as is being marketed or has been marketed by the applicant of the present invention under the name PIPANEL Monitor. As is known, for example, from the description "Pilz, Industriecomputer, Bedienungsanleitung, PIPANEL-Monitor, Sach Nr. 19 557" [Pilz, Industrial computer, Operating instructions, PIPANEL Monitor, part number 19 557], mounting holes for fastening bolts need to be drilled into the wall for installation purposes. These mounting holes need to be drilled at precisely defined positions (with a small tolerance). Such a known operator terminal therefore requires relatively complex mounting or installation in the cutout in the wall, in particular precise drill holes, and therefore a long mounting time.

An operator terminal of this type can furthermore be, for example, an operator terminal as is marketed by the applicant of the present invention under the name PMI®. As is known, for example from the description "Pilz, PMIvisu/PMIopen IV, Bedienterminals, Bedienungsanleitung Sach-Nr. 21 897-01" [Pilz, PMIvisu/PMIopen IV, Operator terminals, Operating instructions, part number 21 897-01], the operator terminal can be installed into the cutout in the wall with the aid of a plurality of mounting plates and button-head screws (in particular in the case of the model PMI 426/431/438). Each of the mounting plates is fastened with screws to the housing of the operator terminal. In each case one of the button-head screws is arranged through one of the fastening plates in such a way that the button-head screw presses against the rear side of the wall. In order to mount such an operator terminal, therefore, many parts are required. This known operator terminal also requires relatively complex mounting or installation in the cutout in the wall.

SUMMARY OF THE INVENTION

Against this background, it is an object of the present invention to provide an operator terminal and an operator cabinet of the type mentioned at the outset which allow for a simpler mounting or simpler installation in the cutout of the wall.

In accordance with a first aspect of the invention, there is provided an operator cabinet for operating a technical system, the cabinet comprising a wall having a front side, a rear side and a cutout defined by an inner edge, and further comprising an operator terminal installed in the cutout, wherein the operator terminal comprises a display for displaying at least one system state of the technical system, a transparent element on which the display is arranged, a frame surrounding the transparent element and having an outer frame edge, a plate with an outer plate edge and a plurality of holes, and a plurality of bolts each having a first end and a second end, the outer frame edge being dimensioned so as to be larger than the inner edge of the cutout such that the frame rests with a frame resting area on the front side of the wall, the outer plate edge being dimensioned so as to be larger than the inner edge of the cutout such that the plate rests with a plate resting area on the rear side of the wall, wherein the first end of each bolt from the plurality of bolts is integrated into the frame by means of an integral design, a welded joint or an adhesive bonding, and wherein the second end of each bolt from the plurality of bolts extends through the cutout up to and through a corresponding hole from the plurality of holes.

In accordance with a further aspect, there is provided in an operator cabinet for operating a technical system, the cabinet comprising a wall having a front side, a rear side and a cutout defined by an inner edge, an operator terminal comprising a display for displaying at least one system state of the technical system, a transparent element on which the display is arranged, a frame surrounding the transparent element and having an outer frame edge, a plate with an outer plate edge and a plurality of holes, and a plurality of bolts each having a first end and a second end, the outer frame edge being dimensioned so as to be larger than the inner edge of the cutout such that the frame can rest with a frame resting area on the front side of the wall, when the operator terminal is arranged in the cutout, the outer plate edge being dimensioned so as to be larger than the inner edge of the cutout such that the plate can rest with a plate resting area on the rear side of the wall, when the operator terminal is arranged in the cutout, wherein the first end of each bolt from the plurality of bolts is integrated into the frame by means of an integral design, a welded joint or an adhesive bonding, and wherein the second end of each bolt from the plurality of bolts is configured to extend through the cutout up to and into a corresponding hole from the plurality of holes.

The novel operator terminal thus uses a plate having a plurality of holes, into which (when the terminal is in the installed state) in each case a corresponding bolt can engage. In particular, each hole is arranged and formed in such a way that the corresponding bolt can engage in it. In this case, a bolt can be an elongate element, in particular an element with a length which is much greater than its diameter or its width. Each bolt is arranged with its first end on the frame and extends, when installed, with its second end through the cutout. Each bolt therefore extends, when installed, through the cutout or is arranged therein. Each hole in the plate is arranged in a position corresponding to the corresponding bolt. In particular, the holes each are arranged in an area of the plate that is located within the cutout of the wall, when installed, (and when viewed in a plan view onto the operator terminal or in a plane parallel to a wall plane defined by the wall). The plate protrudes in particular into the cutout in the wall in such a way that in each case one of the bolts can engage in a corresponding hole in the plate. In particular, the bolts each are arranged (with the first end) in an area of the frame which, when installed, is located within the cutout in the wall (when viewed in a plan view onto the operator terminal or in a plane parallel to a wall plane defined by the wall). The bolts extend in particular in each case (with the second end) in a direction which runs perpendicular to a plane defined by the wall. Each bolt can in particular have a length (in the direction perpendicular to the wall plane) which extends beyond the plate with the second (outwardly protruding) end, when installed. In order to fasten the operator terminal securely to the wall, the operator terminal can in particular comprise a plurality of securing elements, wherein a securing element can be positioned, or, when installed, is positioned, on each of the bolts (or on the second end).

For installation in the cutout of the wall, the operator terminal is, in a first step, arranged in the cutout in the wall (with the transparent element and the frame on the front side of the wall). In a second step, the plate is arranged on the rear side of the wall, each bolt engaging in a corresponding hole. In a third step, in each case one corresponding securing element (for example a nut) is positioned onto in each case one bolt in order to securely fasten the operator terminal to the wall.

The mounting or installation is therefore relatively simple. It is not necessary to provide any drilled holes in the wall and only a few parts are required for the installation. Furthermore, optimum sealing between the operator terminal and the wall is achieved. The abovementioned object is therefore completely achieved.

In a refinement, the frame resting area is located in a region between the outer frame edge and the inner edge of the cutout, and/or the plate resting area is located in a region between the outer plate edge and the inner edge of the cutout. In one variant, each bolt is arranged in an area of the frame which is surrounded by the frame resting area, and/or each hole can be arranged in an area of the plate which is surrounded by the plate resting area.

In this refinement, the plate resting area and the frame resting area are defined more precisely. The plate resting area is defined between the outer plate edge and the inner edge of the cutout. The frame resting area is defined between the outer frame edge and the inner edge of the cutout. In particular, the plate with the plate resting area can touch or face the rear side of the wall. Also, the frame can touch or face the front side of the wall with the frame resting area, in particular. The holes can be arranged in an area of the plate which is surrounded by the plate resting area (i.e. an area within the plate resting area), in particular in a plane parallel to a wall plane defined by the wall. The bolts can (with the first end) be arranged in an area of the frame which is surrounded by the frame resting area (an area within the frame resting area), in particular in a plane parallel to the wall plane. For example in the case of a quadrilateral frame or cutout, the holes can be arranged in an area surrounded by a quadrilateral ring-shaped plate resting area and/or the bolts can be arranged in an area surrounded by a quadrilateral ring-shaped frame resting area.

In a preferred refinement, the operator terminal has a plurality of self-securing elastic nuts. In one variant, each self-securing elastic nut can be provided with a thread and/or each bolt can be a threaded bolt (with a corresponding counter thread). Alternatively, the bolt can be a threadless bolt. In each case one nut can be positioned on each bolt in order to securely fasten the operator terminal to the wall.

In this refinement, particularly simple and quick secure fastening of the operator terminal to the wall is provided. The securing element is in this case in the form of a self-securing elastic nut. The self-securing elastic nut can be, for example, a nut known under the name SERPRESS. A self-securing elastic nut can be fitted without the use of a tool, simply by hand (with only a small amount of tightening force). Owing to its elasticity, the self-securing elastic nut can be deformed or become twisted when the tightening force is exerted. The self-securing elastic nut can become twisted in such a way that a high holding force is exerted (self-securing). The self-securing elastic nut can in this case rest directly on the plate. There is therefore no need for any plain washers, which in turn means that fewer parts are required for the mounting.

In an alternative refinement, the operator terminal has a plurality of conventional nuts, each provided with a thread. In one variant, each bolt can be a threaded bolt (provided with a corresponding counterthread). In each case one nut can be positioned on each bolt in order to fasten the operator terminal securely to the wall.

In this refinement, an inexpensive secure fastening of the operator terminal to the wall is provided since conventional nuts are used which are less expensive. The securing element is in this case therefore provided in the form of a conventional nut.

In a further refinement, the bolts are arranged in an area of the frame which surrounds the transparent element.

This refinement involves that the region of the display which is visible through the transparent element is not damaged. The bolts each are arranged in an area (in a plane parallel to the wall plane) of the frame outside the transparent element.

In a further refinement, each bolt is fastened with its first end in the frame.

In this refinement, a compact operator terminal is provided. In particular, the bolt can in this case be integrated in the operator terminal (or be an integral part of the frame). Owing to the fact that the bolts are fastened in the frame, bolts do not need to be supplied as separate parts. Therefore, only a few separate parts are required for the installation. Fastened is in this case understood to mean any suitable form of fastening, for example fastening by means of an integral design, a cohesive, form-fitting or force-fitting connection, a welded joint, a screw connection, adhesive bonding or the like.

In a further refinement, the frame has a quadrilateral form with four corner regions and four sides therebetweeen, and a bolt is arranged at least in each corner region.

In this refinement, a simple but effective form of installation is provided by the provision of the bolts in the four corner regions. In addition, sufficient sealing between the operator terminal and the wall is achieved.

In a further refinement, at least one further bolt is arranged on each side.

In this refinement, even better secure fastening of the operator terminal to the wall is provided. In addition, the seal is further improved.

In a further refinement, the plate extends over the entire circumference of the cutout in the wall.

In this refinement, a uniform distribution of force over the entire circumference (total circumference) of the cutout is provided. Optimum sealing between the operator terminal and the wall is thus achieved. In addition, high contact-pressure forces when securely fastening the operator terminal to the wall are possible without the plate being deformed, or without the possibility of the plate being deformed.

In an alternative refinement, the plate can extend only over a substantial part of the circumference of the cutout in the wall.

In this refinement, a uniform distribution of force is likewise achieved, but with less material for the plate. The substantial part of the circumference can be in particular in the range of between 50% and 100%, in particular between 80% and 100%, of the total circumference of the cutout in the wall.

In a further refinement, the plate is formed in one part.

In this refinement, only a few parts are required for the installation. This refinement can be used in particular in combination with the previous refinement.

In an alternative refinement, the plate is formed in at least two parts.

In this refinement, simpler handling during mounting is provided given relatively large dimensions or size of the operator terminal and/or the cutout. In contrast to a large plate in one part, at least two, in particular precisely two, smaller parts of the plate are then provided, which are easier to handle. The at least two parts of the plate can in particular adjoin one another, when installed.

In a further refinement, the operator terminal comprises display electronics for driving the display and a housing in which the display electronics are arranged.

In this refinement, the display electronics for driving the display are protected by the housing.

In a further refinement, the housing extends into a space adjoining the rear side of the wall.

In this refinement, sufficient space is provided in the housing for arranging the display electronics. The housing extends in particular in a direction perpendicular to the wall plane into the space adjoining the rear side (rear space).

In a further refinement, the plate furthermore has a recess, within which the housing can be arranged, when installed.

This refinement involves that (with a view onto the rear side of the wall or from the rear space) a substantial part of the cutout or the operator terminal is covered by the plate, apart from the part in which the housing extends into the space adjoining the rear side of the wall. Therefore, the plate protects the operator terminal from the rear side, while the housing can extend into the space adjoining the rear side. In particular, the recess can form an inner plate edge. The inner plate edge can, when installed, in particular reach up to the housing or be arranged at a short distance from said housing.

In a further refinement, the display electronics comprise a sensor signal input for receiving a sensor signal from a sensor, a processor for generating a control signal by means of processing the sensor signal, and a control signal output for transmitting the control signal to an actuator of the technical system.

In this refinement, the operator terminal or the display electronics is/are suitable not only for display but also for the automated control of the technical system. The display electronics in this case also form a control apparatus for automated control of the technical system.

In an alternative refinement, a control apparatus for automated control of the technical system is provided in the operator cabinet, the control apparatus comprising a sensor input for receiving a sensor signal from a sensor, a processor for generating a control signal by means of processing the sensor signal, and a control signal output for transmitting the control signal to an actuator of the technical system.

In this refinement, the operator cabinet comprises, in addition to the operator terminal, also a control apparatus for automated control of the technical system.

In a further refinement, an operator terminal is provided, wherein the transparent element comprises touchscreen electronics for generating a control signal by means of touching contact with the transparent element.

In this refinement, the operator terminal is also suitable for receiving an input of an operating command. A touchscreen region is provided in order to input the operating command by touching the transparent element.

In a further refinement, the display electronics comprise a control signal input for receiving the control signal, which corresponds to an input of an operating command for controlling the technical system, and a control signal output for transmitting the control signal to the technical system.

In this refinement, manual control of the technical system is provided by entering an operating command, in particular on the touchscreen region of the previous refinement.

It goes without saying that the features mentioned above and yet to be explained below can be used not only in the respectively given combination, but also in other combinations or on their own without departing from the scope of the present invention.

BRIEF DESCRIPTION OF THE DRAWINGS

Exemplary embodiments of the invention are illustrated in the drawings and explained in more detail in the description below. In the drawings.

DESCRIPTION OF PREFERRED EMBODIMENTS

Figure 1:
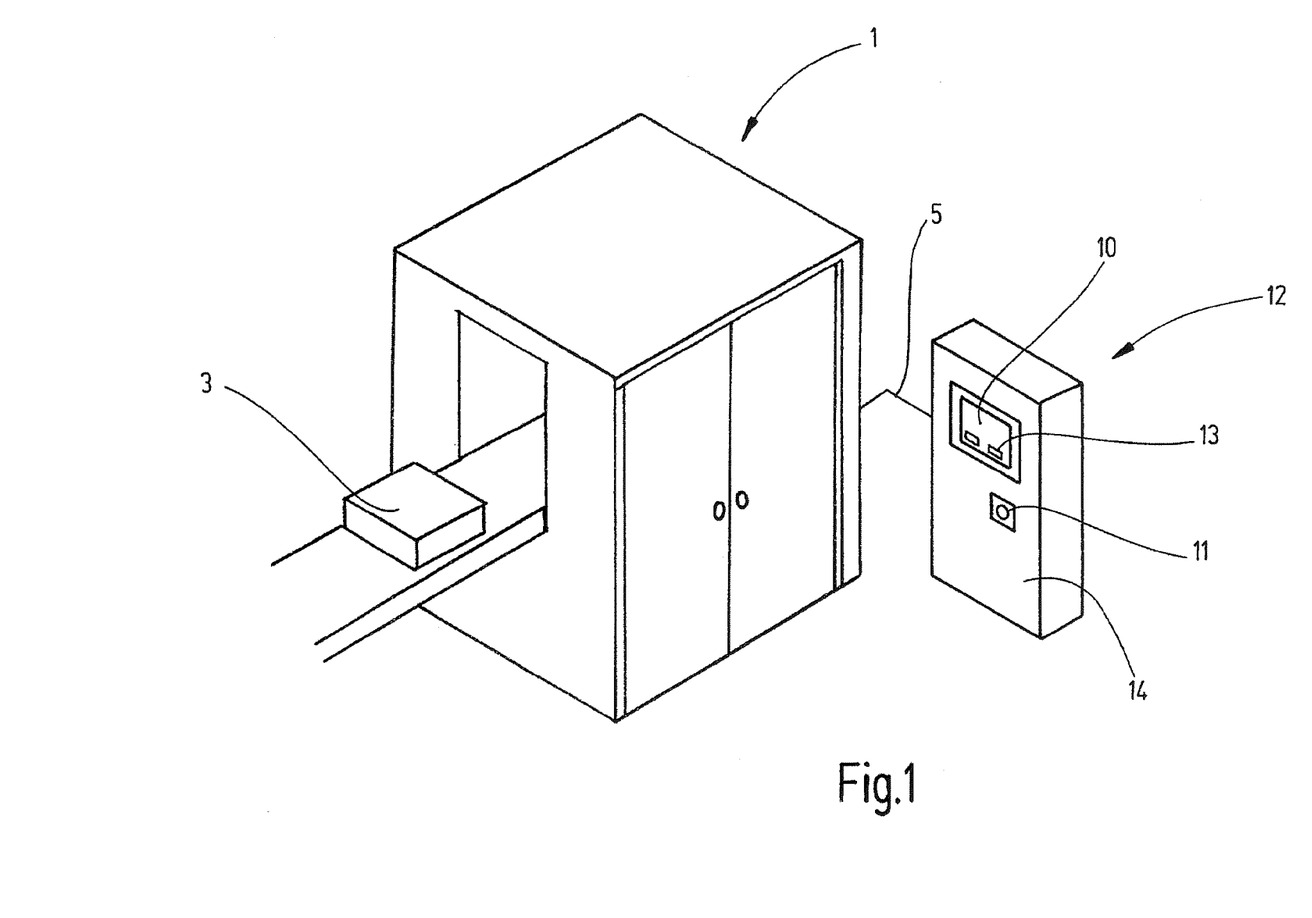
FIG. 1 shows a simplified illustration of an exemplary embodiment of the novel operator terminal with a technical system.

FIG. 1 shows a simplified illustration of an exemplary embodiment of the novel operator terminal 10 with a technical system 1. In the exemplary embodiment shown in FIG. 1, the technical system is arranged in a protected space and is used for processing goods 3. A signal which indicates the state of the technical system 1 (for example diagnosis signal) can be transmitted between the technical system 1 and the operator terminal 10 via a line 5. The operator terminal 10 comprises a display for displaying the at least one state of the technical system 1 corresponding to the signal transmitted via the line 5. The display indicates the state of the technical system 1 (for example for diagnosis) in order that a user can operate the technical system 1 correspondingly, for example by means of actuating an (emergency stop) switch 11, as illustrated in FIG. 1. In addition, the operator terminal 10 can also be configured for receiving an input of an operating command, by means of which the user can operate or manually control the technical system 1. This can be realized, for example, with the aid of a touchscreen. For this purpose, the display can display at least one virtual switch 13 at a predetermined position, with a corresponding control signal being generated by the predetermined position being touched, said corresponding control signal being transmitted to the technical system 1 via line 5.

The operator terminal 10 for operating the technical system 1 is, when installed as illustrated in FIG. 1, mounted in a cutout of a wall 14 having a front side and a rear side, said cutout having with an inner edge. A wall plane E is defined by the wall 14. Furthermore, a space adjoining the rear side 18 of the wall 14 (rear space) and a space adjoining the front side 17 of the wall 14 (front space) are defined by the wall 14. As can be seen in FIG. 1, the operator terminal 10 can be operated from the space adjoining the front side of the wall 14 (front space). The operator terminal shown in FIG. 1 is arranged in an operator cabinet 12 for operating the technical system 1. The wall 14 is a wall of the operator cabinet 12. The operator cabinet can be, for example, a switchgear cabinet, a control desk, a rack or the like.

Figure 2:
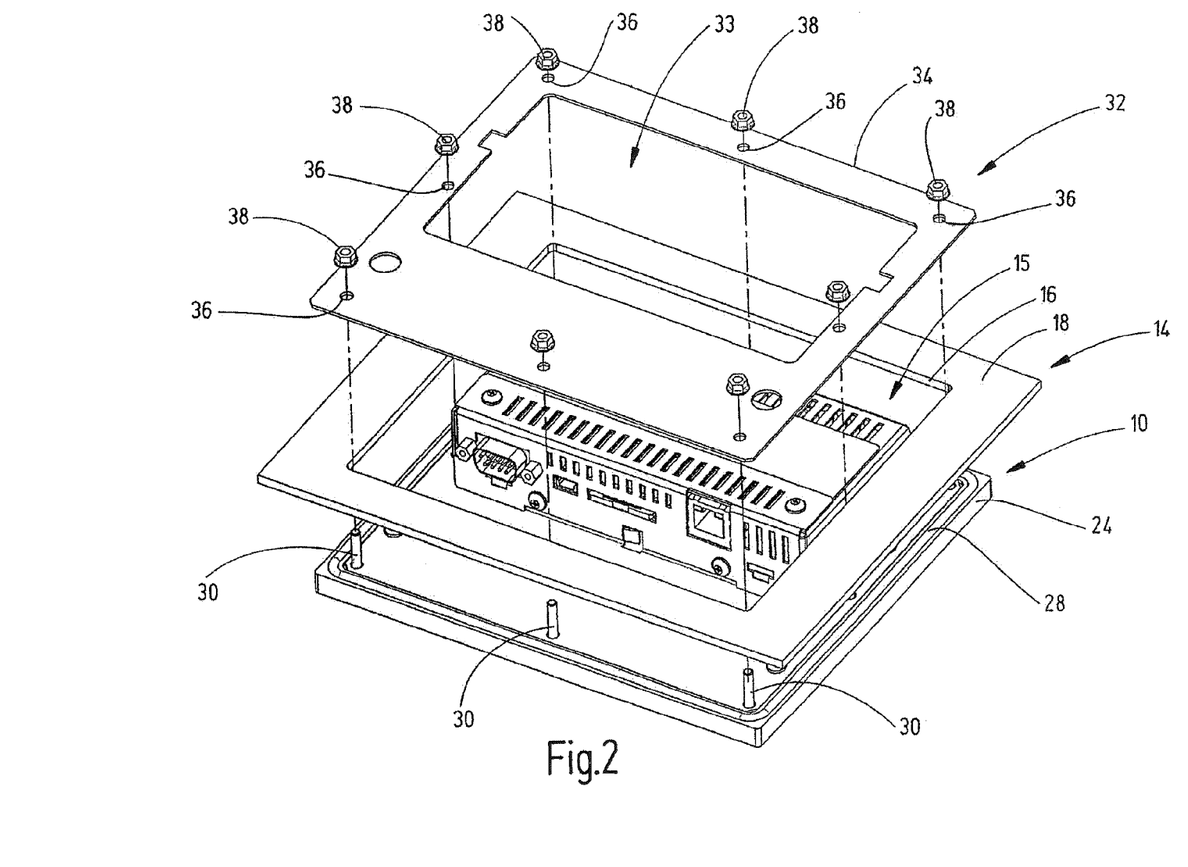
FIG. 2 shows a perspective exploded view of an exemplary embodiment of the novel operator terminal.
Figure 3:
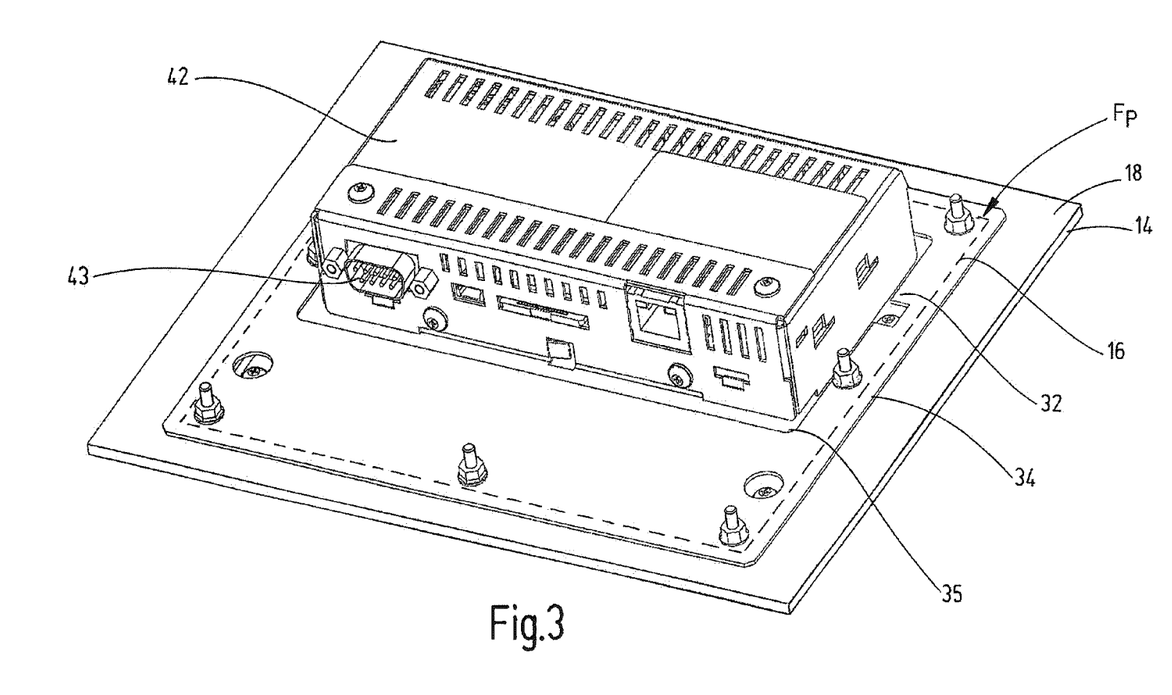
FIG. 3 shows a perspective view of the exemplary embodiment of the operator terminal shown in FIG. 2, when installed.
Figure 4:
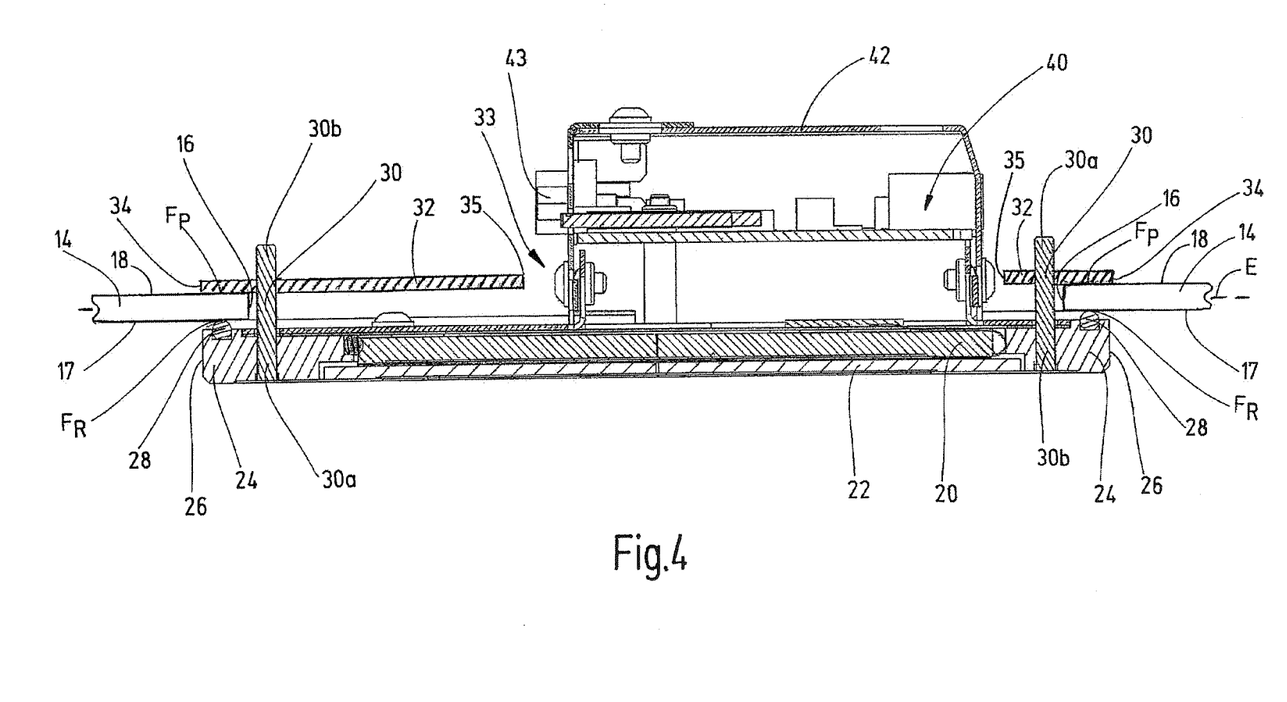
FIG. 4 shows a cross-sectional view of the exemplary embodiment of the operator terminal shown in FIG. 2 and FIG. 3.
Figure 5:
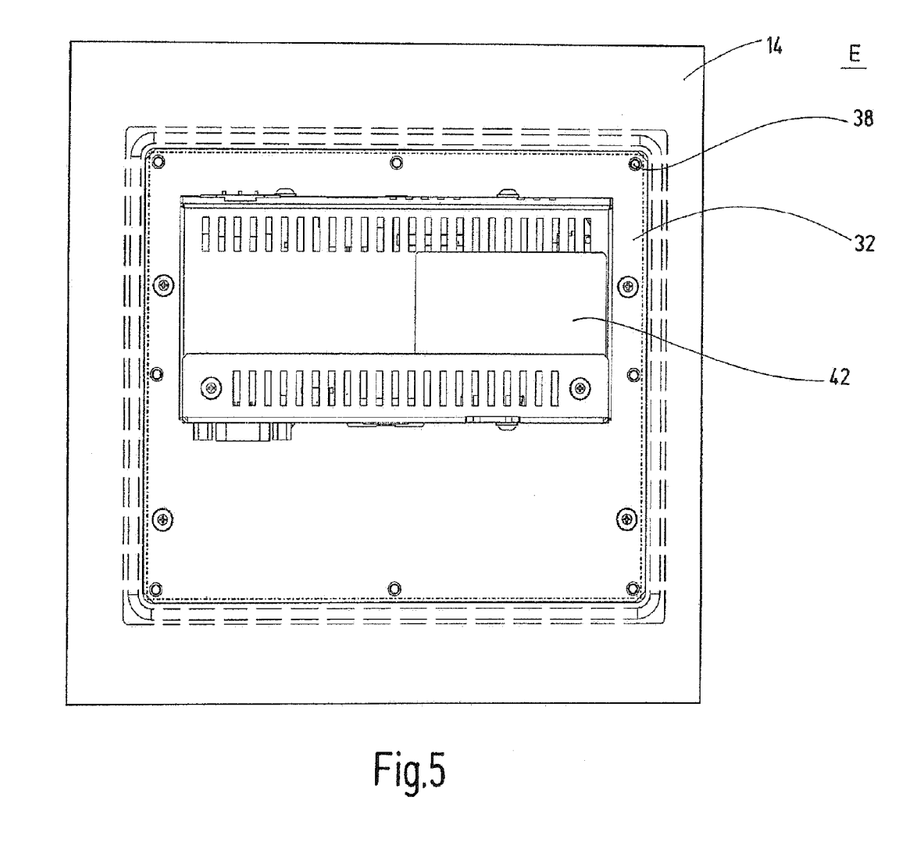
FIG. 5 shows a plan view of the rear side of the exemplary embodiment from FIGS. 2 to 4 of the operator terminal.
Figure 6:
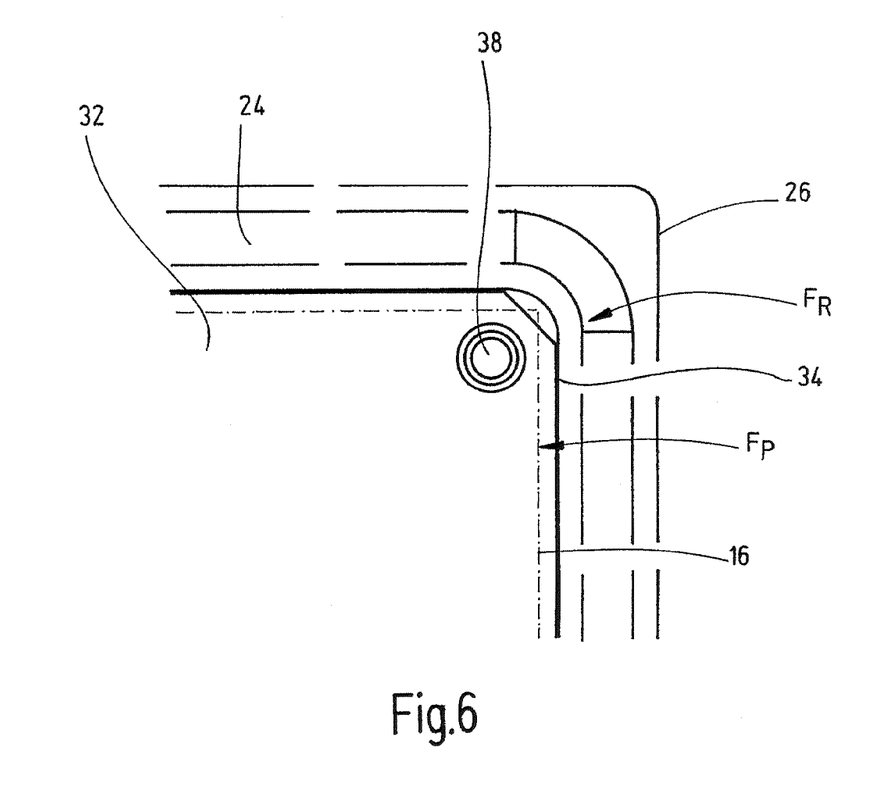
FIG. 6 shows an enlarged detail of FIG. 5.

FIG. 2 shows a perspective exploded view of an exemplary embodiment of the novel operator terminal 10, and FIG. 3 shows a corresponding perspective view of the exemplary embodiment of the operator terminal, when installed. FIG. 4 shows a corresponding cross-sectional view of the exemplary embodiment of the operator terminal. FIG. 5 shows a corresponding plan view of the rear side of the exemplary embodiment of the operator terminal, and FIG. 6 shows an enlarged detail from FIG. 5. In FIG. 3, FIG. 5 and FIG. 6, hidden regions or edges are illustrated by dashed lines.

As can be seen in FIG. 4, the operator terminal 10 comprises a transparent element 22 on which the display 20 is arranged. The transparent element 22 can be, for example, a plate consisting of glass, acrylic glass or another suitable transparent material. A visible region of the display 20 is provided by the transparent element 22. In this case, the display 20 comprises indicator means or light-emitting means for a visual display. The display 20 can be, for example, an LCD display, a plasma display or another suitable form of display.

The transparent element 22 surrounds a frame 24 with an outer frame edge 26. In the exemplary embodiment shown, the frame 24 also surrounds the display 20. The frame 24 can be made, for example, of a metal or another suitable material. The operator terminal 10 furthermore comprises a plurality of bolts 30, each having a first end 30a and a second end 30b. In the exemplary embodiment shown here, each bolt 30 is an elongate element with a round cross section. Each bolt 30 is arranged or fastened with its first end 30a on the frame 24. Each bolt 30 extends, when installed, with its second end 30b through the cutout 15 in the wall 14. In the exemplary embodiment shown, the bolts 30 each extend (with the second end) in a direction which is perpendicular to the wall plane. Each bolt 30 has a length (in the direction perpendicular to the wall plane E) which, when installed, extends with the second (outwardly protruding) end beyond the plate 32.

As can be seen in FIG. 2 to FIG. 6, the operator terminal 10 furthermore comprises a plate 32 with an outer plate edge 34. The plate 32 can be made, for example, of a metal (in particular sheet metal) or another suitable material. The plate 32 has a plurality of holes 36, each hole 36 being arranged in a position corresponding to a (corresponding) bolt 30 (of the plurality of bolts), with the result that, when installed, the corresponding bolt 30 can engage therein. In particular, each hole 36 is formed in such a way that the corresponding bolt 30 can engage therein or be arranged thereon with a precise fit.

The outer frame edge 26 is dimensioned so as to be larger than the inner edge 16 of the cutout 15, with the result that, when installed, the frame 24 can rest with a frame resting area $F_R$ on the front side 17 of the wall 14. The outer plate edge 34 of the plate 32 is dimensioned so as to be larger than the inner edge 16 of the cutout 15, with the result that, when installed, the plate 32 can rest with a plate resting area $F_P$ on the rear side 18 of the wall 14.

The holes 36 are arranged in an area of the plate 32 which, when installed, is located within the cutout 15 in the wall 14 (when viewed in a plan view of the operator terminal 10, as shown in FIG. 5, or in a plane parallel to the wall plane E). The plate 32 protrudes into the cutout 15 in the wall 14 in such a way that in each case one of the bolts 30 can engage in a corresponding hole 36 in the plate 32. The bolts 30 are arranged in an area of the frame 24 which, when installed, is located within the cutout 15 in the wall 14 (when viewed in a plan view of the operator terminal 10, as shown in FIG. 5, or in a plane parallel to the wall plane E).

The wall frame resting area $F_R$ is located in a region between the outer frame edge 26 and the inner edge 16 of the cutout 15. In the exemplary embodiment shown, the frame 24 comprises a sealing ring 28. When installed, only sealing ring 28 touches the front side 17 of the wall 14 in this exemplary embodiment. However, it should be understood that the frame resting area $F_R$ is nevertheless defined in the entire region between the outer frame edge 26 and the inner edge 16 of the cutout 15. Therefore, the frame 24 with the frame resting area $F_R$ touches the front side 17 of the wall 14 or with the frame resting area $F_R$ faces the front side 17 of the wall 14. Each bolt 30 is arranged in an area of the frame 24 which is surrounded by the frame resting area $F_R$ (within the frame resting area) as can be seen in FIG. 6, for example. In this exemplary embodiment, the frame resting area is a quadrilateral ring-shaped frame resting area. Each bolt is therefore arranged in an area surrounded by the quadrilateral ring-shaped frame resting area $F_R$.

The plate resting area $F_P$ is located in a region between the outer plate edge 34 and the inner edge 16 of the cutout 15. In the exemplary embodiment shown, the plate with the entire plate resting area $F_P$ rests on the rear side 18 of the wall 14. The plate 32 protrudes into the cutout 15. The plate 32 protrudes in particular into the cutout in the wall 14 in such a way that in each case one of the bolts 30 can engage in a corresponding hole 36 in the plate. Each hole 36 is arranged in an area of the plate 32 which is surrounded by the plate resting area $F_P$ (within the plate resting area). In the exemplary embodiment shown, the plate resting area is a quadrilateral ring-shaped plate resting area $F_P$. Therefore, each of the holes is arranged in an area surrounded by the quadrilateral ring-shaped plate resting area $F_P$.

In order to fasten the operator terminal securely to the wall, the operator terminal 10 comprises a plurality of securing elements, in this exemplary embodiment nuts 38, wherein a securing element can be positioned, or, when installed, is positioned, on each bolt 30 (or on its second end 30b). The securing element is thus positioned on the second (outwardly protruding) end 30b of the bolt 30 and therefore fastened securely.

With respect to FIG. 2, a description will now be given of the way in which the operator terminal 10 is installed into the cutout 15 of wall 14. In a first step, the operator terminal 10 is arranged in the cutout 15 in the wall 14, with the transparent element 22 and the frame 24 on the front side 17 of the wall 14 (front installation), parallel to the wall plane E. In a second step, the plate 32 is arranged on the rear side 18 of the wall 14, parallel to the wall plane E, with each bolt 30 engaging in a corresponding hole 36 in the plate 32. In a third step, in each case one corresponding securing means, in this exemplary embodiment a nut 38, is positioned on in each case one bolt 30 (or on its second end 30b) in order to fasten the operator terminal 10 securely to the wall 14.

In the exemplary embodiment shown, the securing elements are a plurality of self-securing elastic nuts 38. Each self-securing elastic nut 38 is provided with a thread. Each bolt 30 is a threaded bolt (provided with a corresponding counter thread). In each case one of the plurality of nuts 38 is positioned on each of the bolts 30 in order to fasten the operator terminal securely to the wall 14. It should be understood that any other suitable type of securing element can be provided. For example, each bolt 30 could also be a threadless bolt (bolt without thread or bolt with a flat or smooth surface). For example, the securing elements could be a plurality of conventional nuts provided with a thread. In each case one nut with the thread can be positioned or screwed onto each of the bolts provided with the counter thread in order to fasten the operator terminal securely to the wall.

In the exemplary embodiment shown, the frame 24 has a quadrilateral, in this case rectangular, form with four corner regions and four sides therebetween. A bolt 30 is arranged in each corner region. Furthermore, a further bolt 30 is arranged on each side. Therefore, in the exemplary embodiment shown, the operator terminal comprises 8 bolts 30 and 8 corresponding holes 36. However, it should be understood that any other suitable number of holes and bolts can be provided.

The operator terminal 10 comprises display electronics 40 for driving the display 20, as can be seen in the cross-sectional view in FIG. 4, for example. The display electronics 40 can comprise a processor for generating a display signal for driving the display 20 (or the indicator means or light-emitting means). An operating system, for example Windows CE or the like, can be implemented on the processor. The operator terminal 10 furthermore comprises a housing 42, in which the display electronics 40 are arranged. The housing 42 extends into a space adjoining the rear side 18 of the wall 14 (rear space) in a direction perpendicular to the wall plane E. The operator terminal 10 of the exemplary embodiment shown further comprises an I/O part 43, as illustrated in FIG. 3, which is electrically connected to the display electronics 40. The I/O part 43 is in this case arranged on the housing 42. For example, the signal which indicates the state of the system 1 can be transmitted to the operator terminal 10 via the I/O part 40. In FIG. 3, an I/O part 43 is identified purely by way of example. It should be understood that the I/O part 43 can be any suitable type of I/O part with inputs and/or outputs.

In the exemplary embodiment shown, the plate 32 extends over the entire circumference of the cutout 15 in the wall 14. In this case, the plate 32 is formed in one part. The plate 32 has a recess 33, within which the housing 42 can be arranged, when installed. This means that, when viewed from the space adjoining the rear side 18 of the wall 14 (rear space), a substantial part of the cutout 15 or the operator terminal 10 is hidden by the plate 32, apart from the part in which the housing extends into the space adjoining the rear side 18 of the wall 14 (rear space). Therefore, the plate 32 protects the operator terminal 10 from the rear side or towards the rear space, while the housing can extend into the rear space. The recess 33 forms an inner plate edge 35. In the exemplary embodiment shown, the inner plate edge 35 is spaced apart from the housing 42 by a short distance, when installed.

Although in the exemplary embodiment shown the plate 32 is formed in one part, it should be understood that the plate 32 can alternatively be formed in at least two parts, in particular in the case of relatively large dimensions of the operator terminal 10 and/or the cutout 15. Furthermore, it should be understood that although the plate 32 in the exemplary embodiment shown extends over the entire circumference of the cutout 15 in the wall 14, the plate may alternatively extend only over a substantial part of the circumference of the cutout 15. The substantial part of the circumference can be in particular in the range of between 50% and 100%, in particular between 80% and 100%, of the total circumference of the cutout 15 in the wall 14.

The operator terminal 10 can furthermore be configured for receiving an input of an operating command, by means of which the user can operate or manually control the technical system 1. For this purpose, the transparent element 22 can comprise a touchscreen electronics for generating á control signal by touching contact with the transparent element 22, for example touching a virtual switch displayed by the display 20 at a predetermined position. The display electronics 40 can then comprise a control signal input for receiving the control signal generated by means of touching contact with the transparent element 22, which control signal corresponds to an input of an operating command for controlling the technical system. Furthermore, the display electronics 40 can comprise a control signal output for transmitting the control signal to the technical system 1. For example, the control signal can be transmitted to the technical system 1 via the I/O part 43.

The operator terminal can furthermore be configured for automated control of the technical system 1, as already described with respect to FIG. 1. In this regard, the display electronics 40 can comprise a sensor signal input for receiving a sensor signal from a sensor, a processor for generating a control signal by means of processing the sensor signal, and a control signal output for transmitting the control signal to an actuator of the technical system 1. The processor can be the same processor that is used for generating the display signal.

What is claimed is:

1. An operator cabinet for operating a technical system, the cabinet comprising a wall having a front side, a rear side and a cutout defined by an inner edge, and further comprising an operator terminal installed in the cutout, wherein the operator terminal comprises:
a display for displaying at least one system state of the technical system,
a transparent element on which the display is arranged,
a frame surrounding the transparent element and having an outer frame edge,
a plate with an outer plate edge and a plurality of holes, and
a plurality of bolts each having a first end and a second end,
the outer frame edge being dimensioned so as to be larger than the inner edge of the cutout such that the frame rests with a frame resting area on the front side of the wall,
the outer plate edge being dimensioned so as to be larger than the inner edge of the cutout such that the plate rests with a plate resting area on the rear side of the wall,
wherein the first end of each bolt from the plurality of bolts is integrated into the frame by means of an integral design, a welded joint or an adhesive bonding, and
wherein the second end of each bolt from the plurality of bolts extends through the cutout up to and through a corresponding hole from the plurality of holes.

2. The operator cabinet of claim 1, wherein the frame resting area is located in a region between the outer frame edge and the inner edge of the cutout.

3. The operator cabinet of claim 1, wherein the plate resting area is located in a region between the outer plate edge and the inner edge of the cutout.

4. The operator cabinet of claim 1, wherein the frame has a quadrilateral form with four corner regions and four sides therebetween, and wherein a bolt is arranged at least in each of said four corner regions.

5. The operator cabinet of claim 1, wherein the plate extends along the entire inner edge of the cutout.

6. The operator cabinet of claim 1, wherein the plate is integrally formed as one part.

7. The operator cabinet of claim 1, wherein the plate is formed in at least two parts.

8. The operator cabinet of claim 1, further comprising display electronics for driving the display and comprising a display housing in which the display electronics are arranged.

9. The operator cabinet of claim 8, wherein the display housing extends into a space adjoining the rear side of the wall.

10. The operator cabinet of claim 8, wherein the plate further comprises has a recess, within which the display housing is arranged.

11. The operator cabinet of claim 8, with the display electronics comprising a sensor signal input for receiving a sensor signal from an external sensor, a processor for generating a control signal in response to processing the sensor signal, and a control signal output for transmitting the control signal to an external actuator of the technical system.

12. The operator cabinet of claim 8, with the display electronics further comprising a control signal input for receiving a control signal representing an operating command for controlling the technical system, and comprising a control signal output for transmitting the control signal to the technical system.

13. The operator cabinet of claim 12, wherein the transparent element comprises touchscreen electronics for generating the control signal by touching contact with the transparent element.

14. The operator cabinet of claim 1, further comprising a plurality of self-securing elastic nuts mounted on the second end of each from the plurality of bolts.

15. In an operator cabinet for operating a technical system, the cabinet comprising a wall having a front side, a rear side and a cutout defined by an inner edge, an operator terminal comprising:
   a display for displaying at least one system state of the technical system,
   a transparent element on which the display is arranged,
   a frame surrounding the transparent element and having an outer frame edge,
   a plate with an outer plate edge and a plurality of holes, and
   a plurality of bolts each having a first end and a second end,
   the outer frame edge being dimensioned so as to be larger than the inner edge of the cutout such that the frame can rest with a frame resting area on the front side of the wall, when the operator terminal is arranged in the cutout,
   the outer plate edge being dimensioned so as to be larger than the inner edge of the cutout such that the plate can rest with a plate resting area on the rear side of the wall, when the operator terminal is arranged in the cutout,
   wherein the first end of each bolt from the plurality of bolts is integrated into the frame by means of an integral design, a welded joint or an adhesive bonding, and
   wherein the second end of each bolt from the plurality of bolts is configured to extend through the cutout up to and into a corresponding hole from the plurality of holes.

16. An operator terminal for operating a technical system, the operator terminal being configured for installation in a cutout of a wall having a front side and a rear side, said cutout defining an inner edge, said operator terminal comprising a display for displaying at least one state of the technical system, a transparent element on which the display is arranged, a frame surrounding the transparent element and having an outer frame edge, a plurality of bolts, each having a first end and a second end, and a plate with an outer plate edge, the outer frame edge being dimensioned so as to be larger than the inner edge of the cutout, with the result that, when installed, the frame can rest with a frame resting area on the front side of the wall, the outer plate edge being dimensioned so as to be larger than the inner edge of the cutout, with the result that, when installed, the plate can rest with a plate resting area on the rear side of the wall, the plate having a plurality of holes, each hole being arranged in a position corresponding to one bolt, with the result that, when installed, the corresponding bolt can engage in said hole, each bolt being arranged with its first end on the frame, and each bolt extending, when installed, with its second end through the cutout.

* * * * *